US007007248B2

(12) United States Patent
Blinne et al.

(10) Patent No.: US 7,007,248 B2
(45) Date of Patent: Feb. 28, 2006

(54) METHOD AND APPARATUS FOR IMPLEMENTING ENGINEERING CHANGE ORDERS

(75) Inventors: Richard Blinne, Ft. Collins, CO (US); Viswanathan Lakshmanan, Thornton, CO (US); Venugopalan Pranesan, Thornton, CO (US)

(73) Assignee: LSI Logic Corporation, Milpitas, CA (US)

( * ) Notice: Subject to any disclaimer, the term of this patent is extended or adjusted under 35 U.S.C. 154(b) by 257 days.

(21) Appl. No.: 10/439,373

(22) Filed: May 15, 2003

(65) Prior Publication Data

US 2004/0230920 A1    Nov. 18, 2004

(51) Int. Cl.
| | |
|---|---|
| G06F 17/50 | (2006.01) |
| G06F 19/00 | (2006.01) |
| G06F 7/00 | (2006.01) |
| G06F 17/30 | (2006.01) |

(52) U.S. Cl. .................. 716/2; 716/3; 716/13; 716/10; 716/7; 716/11; 700/105; 707/1; 707/104.1

(58) Field of Classification Search .................... 716/2, 716/3, 13, 10, 7, 11; 700/125, 105; 707/1, 707/104.1
See application file for complete search history.

(56) References Cited

U.S. PATENT DOCUMENTS

| | | | | |
|---|---|---|---|---|
| 5,191,534 | A | * | 3/1993 | Orr et al. ..................... 700/105 |
| 5,311,424 | A | * | 5/1994 | Mukherjee et al. ........... 705/29 |
| 5,315,509 | A | * | 5/1994 | Natarajan ..................... 705/28 |
| 5,317,729 | A | * | 5/1994 | Mukherjee et al. ............. 707/3 |
| 5,574,898 | A | * | 11/1996 | Leblang et al. ................. 707/1 |
| 5,826,265 | A | * | 10/1998 | Van Huben et al. ............. 707/8 |
| 6,009,248 | A | * | 12/1999 | Sato et al. ...................... 716/2 |
| 6,031,981 | A | * | 2/2000 | Lee et al. ...................... 716/10 |
| 6,086,630 | A | * | 7/2000 | Williams et al. ............... 716/15 |
| 6,167,401 | A | * | 12/2000 | Csipkes et al. ............... 707/10 |
| 6,188,402 | B1 | * | 2/2001 | Csipkes et al. ............. 715/705 |
| 6,226,777 | B1 | * | 5/2001 | Zhang ............................ 716/5 |
| 6,260,177 | B1 | * | 7/2001 | Lee et al. ....................... 716/2 |
| 6,272,665 | B1 | * | 8/2001 | Johnson et al. ................. 716/3 |
| 6,317,865 | B1 | * | 11/2001 | Itoh ............................. 716/11 |
| 6,366,874 | B1 | * | 4/2002 | Lee et al. ...................... 703/14 |

(Continued)

FOREIGN PATENT DOCUMENTS

JP          0313755 A    *    6/1991

(Continued)

OTHER PUBLICATIONS

Hardwick et al., "Concurrent Engineering With Delta Files", IEEE Computer Graphics and Applications, vol. 15, No. 1, Jan. 1995, pp. 62-68.*

(Continued)

*Primary Examiner*—Matthew Smith
*Assistant Examiner*—Phallaka Kik
(74) *Attorney, Agent, or Firm*—Trexler, Bushnell, Giangiorgi & Blackstone, LTD

(57) ABSTRACT

A tool and method for implementing engineering change orders. The tool and method provides that a change file is checked, equivalent engineering change orders are computed and applied to an active cell. The engineering change orders are registered with a pre-determined tool name, and it is detected and reported if another tool needs to be run to restore routing information. The active cell is not automatically saved after the engineering change orders are applied. Instead, a user must manually save the active cell after the tool is run. The tool can work with three different name spaces: Verilog, VHDL and Avant! Verilog.

19 Claims, 6 Drawing Sheets

U.S. PATENT DOCUMENTS

| | | |
|---|---|---|
| 6,453,454 B1 * | 9/2002 | Lee et al. .................... 416/11 |
| 6,530,073 B1 * | 3/2003 | Morgan ....................... 716/18 |
| 6,618,834 B1 * | 9/2003 | Takeyama et al. ............. 716/2 |
| 6,678,871 B1 * | 1/2004 | Takeyama et al. ............. 716/6 |
| 6,725,435 B1 * | 4/2004 | Cote et al. ..................... 716/5 |
| 6,745,371 B1 * | 6/2004 | Konstadinidis et al. ........ 716/2 |
| 6,823,497 B1 * | 11/2004 | Schubert et al. ............... 716/4 |
| 6,873,997 B1 * | 3/2005 | Majjasie et al. ......... 707/104.1 |
| 6,898,770 B1 * | 5/2005 | Boluki et al. ................... 716/6 |
| 6,922,817 B1 * | 7/2005 | Bradfield et al. .............. 716/1 |
| 2002/0035451 A1 * | 3/2002 | Rothermel .................... 703/1 |
| 2002/0083398 A1 * | 6/2002 | Takeyama et al. ............. 716/1 |
| 2002/0162086 A1 * | 10/2002 | Morgan ....................... 716/18 |
| 2003/0009727 A1 * | 1/2003 | Takeyama et al. ............. 716/1 |
| 2003/0078975 A1 * | 4/2003 | Ouchi ......................... 709/205 |
| 2003/0131325 A1 * | 7/2003 | Schubert et al. ............... 716/4 |
| 2003/0145297 A1 * | 7/2003 | Cole et al. ..................... 716/6 |
| 2003/0188268 A1 * | 10/2003 | Konstadinidis et al. ........ 716/2 |
| 2004/0098382 A1 * | 5/2004 | Chuang et al. ................ 707/3 |
| 2004/0098383 A1 * | 5/2004 | Chuang et al. ................ 707/3 |
| 2004/0107076 A1 * | 6/2004 | Tseng et al. ................... 703/1 |
| 2004/0139408 A1 * | 7/2004 | Boluki et al. .................. 716/5 |
| 2004/0181769 A1 * | 9/2004 | Kochpalcharin et al. ...... 716/19 |
| 2004/0193602 A1 * | 9/2004 | Liu et al. ....................... 707/9 |
| 2004/0199879 A1 * | 10/2004 | Bradfield et al. ............... 716/1 |
| 2004/0243267 A1 * | 12/2004 | Tu et al. ..................... 700/105 |
| 2005/0010880 A1 * | 1/2005 | Schubert et al. ............... 716/4 |
| 2005/0080502 A1 * | 4/2005 | Chernyak et al. ............ 700/97 |

FOREIGN PATENT DOCUMENTS

| | | | |
|---|---|---|---|
| JP | 2002149730 A | * | 5/2002 |
| TW | 563050 A | * | 11/2003 |

OTHER PUBLICATIONS

Wederhold et al., "A Database Approach to Communication in VLSI Design", IEEE Transactions on Computer-Aided Design of Integrated Circuits and Systems, vol. 1, No. 2, Apr. 1982, pp. 57-63.*

Mark et al., "Generating Customized Software Engineering Information Bases From Software Process and Product Specifications", Proceedings of the Twenty-Second Annual Hawaii International Conference on System Sciences, vol. 2, Jan. 3, 1989, pp. 587-595.*

NA9209342, "Module Design Change Zero Defect Verification", IBM Technical Disclosure Bulletin, vol. 35, No. 4A, Sep. 1992, pp. 342-344 (5 pages).*

NA9209189, "Automated Management and Control of an Engineering Change", IBM Technical Disclosure Bulletin, vol. 35, No. 4A, Sep. 1992, pp. 189-194 (8 pages).*

NN87081367, "Engineering Change Release and Diagnostic change Procedure for Technician Terminal", IBM Technical Disclosure Bulletin, vol. 30, No. 3, pp. 1367-1368 (4 pages).*

NA84035127, "Automatic Engineering Change Analysis for Timing Analysis", IBM Technical Disclosure Bulletin, vol. 26, No. 10A, pp. 5127-5131 (6 pages).*

NN81102580, "Tester Independent High Level Language Compiler", IBM Technical Disclosure Bulletin, vol. 24, No. 5, pp. 2580-2586 (9 pages).*

* cited by examiner

METHOD AND APPARATUS FOR IMPLEMENTING ENGINEERING CHANGE ORDERS

REFERENCE to COMPACT DISCS (CD-R's) FILED WITH THE APPLICATION

Duplicate compact discs (CD-R's) have been filed with the present application as a computer program listing appendix. Each compact disc contains the following files: "eco_avanti_db.py" (22 kB, created May 7, 2003); "eco_exception.py" (8 kB, created May 7, 2003); "eco_log.py" (4 kB, created May 7, 2003); "eco_nmap.py" (12 kB, created May 7, 2003); "eco_parser.py" (13 kB, created May 7, 2003); "eco_read.py" (15 kB, created May 7, 2003); "eco_statements.py" (89 kB, created May 7, 2003). The material on the compact discs is incorporated herein by reference as a computer program listing appendix.

COPYRIGHT NOTICE

A portion of the disclosure of this patent application (including the files contained on the compact discs) contains material, which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND OF THE INVENTION

The present invention generally pertains to a method and apparatus for implementing engineering change orders (ECOs).

Engineering change orders (ECOs) are very common for a design in progress owing to a multitude of factors that include but are not limited to improving performance (timing based), enhancing functionality and/or fixing existing errors. The need for an ECO is typically based off the results of design analysis, static timing analysis, etc.

Changes to the design are implemented via file-based methodologies. The tool being disclosed (lsiecoread) handles a file-based ECO, i.e., reads an input file that describes the changes that need to be made to the design and updates the layout database (Synopsys Apollo) representation of the design, accordingly. The tool being disclosed pertains to the field of application specific integrated circuit (ASIC) design, especially the physical design aspect wherein changes/modifications are made to the design database to allow for an accurate representation of the customer net list or design specification, both for meeting timing requirements and functionality.

Traditional file-based ECOs necessitate the user to write out the ECOs in a tool specific syntax that is non-trivial, non-comprehendible, error-prone and extremely time consuming.

Existing approaches include the creation of tool-specific ECO files (such as Avant! ECO files in the design flow of LSI Logic, Assignee of the present application) that have inherent disadvantages as described above. One primary drawback of the Avant! ECO files is that they are extremely difficult to read and comprehend, thus affecting designer productivity. The non-friendly syntax also makes the files extremely hard to edit and maintain.

Tool specific ECOs (Synopsys/Apollo ECOs) exist today that could be used. However, significant limitations and drawbacks of this approach include, but are not limited to: 1) ECOs have to be primarily net based; 2) inefficient from a creation/editing/maintainability standpoint; and 3) impacts designer productivity negatively.

Therefore, an improved method and apparatus for implementing ECOs is needed. The present invention provides such an improved method and apparatus for implementing ECOs. Features and advantages of the present invention will become apparent upon a reading of the attached specification, in combination with a study of the drawings.

OBJECTS AND SUMMARY OF THE INVENTION

A primary object of an embodiment of the invention is to provide an improved method and apparatus for implementing engineering change orders.

An object of an embodiment of the invention is to provide a method and apparatus for implementing engineering change orders which allows a user to specify any and all changes required to the design database in a user-friendly, comprehendible, easy to learn and maintain type of format to the tool, for processing.

Another object of an embodiment of the invention is to provide tools for implementing engineering change orders, which are simple, user-friendly, manageable and easy to decipher/edit.

Another object of an embodiment of the invention is to provide tools for implementing engineering change orders that provide significant turn-around-time (TAT) benefits in comparison to the Synopsys/Avant! ECO flow.

Yet another object of an embodiment of the invention is to provide tools for implementing engineering change orders which support port based ECOs, compared to net based ECOs, which are extremely easy to implement and do not require the user to keep track of nets that are hooked up to these ports.

Briefly, and in accordance with at least one of the foregoing, an embodiment of the present invention provides a tool and method for implementing engineering change orders. The tool and method provides that a change file is checked, equivalent engineering change orders are computed and applied to an active cell. The engineering change orders are registered with a pre-determined tool name, and it is detected and reported if another tool needs to be run to restore routing information. The active cell is not automatically saved after the engineering change orders are applied. Instead, a user must manually save the active cell after the tool is run. The tool can work with three different name spaces: Verilog, VHDL and Avant! Verilog.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE ILLUSTRATED EMBODIMENT

Figure 1:
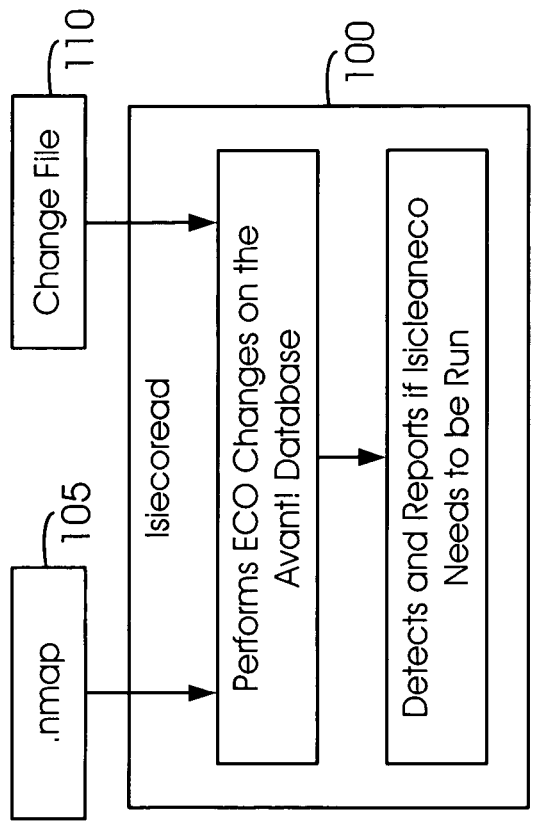
FIG. 1 is a flow diagram of a tool, which is in accordance with an embodiment of the present invention.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

The tool 100, which will be referred to herein as the lsiecoread tool, replaces the manual engineering change order (ECO) by change file procedure. Using the lsiecoread tool 100 provides a simpler, faster, and more reliable way to make ECO changes compared to the Avant! ECO by change file approach. The lsiecoread tool 100 is used with Avanti's Jupiter or Planet tools. The tool may be adapted to work within any physical layout database environment, but in this case is more representative of the Avant!/Synopsys tool suite.

The lsiecoread tool 100 allows use of different name spaces (Verilog, VHDL, Avant! Verilog). The lsiecoread tool 100 provides user-friendly change file syntax. The lsiecoread tool 100 checks the validity of ECOs that are in the change file 110. The tool 100 checks for the validity of the change file prior to computing the equivalent ECOs and applying them to the active open CEL view. The validity of the change file can be explicitly checked. For example, the tool can be used in "check-change-file mode" using the --check_only switch. Here, only the syntax of the change file is verified and no database crosschecks are made. The lsiecoread tool 100 reports for open inputs in the database. These features of the lsiecoread tool 100 are designed to improve turn-around time (TAT) while providing reliability in ECO operation.

The lsiecoread tool 100 does the following (see FIGS. 1 and 10):

1. Checks for correctness of the change file. If the check fails, the function exits.
2. Computes equivalent ECOs for the file and applies them to the active cell.
3. Registers the ECO with lsiecoread as the tool name.
4. Detects and reports if the lsicleaneco tool (an LSI internal tool) needs to be run on the design (lsicleaneco is a tool that is run by the user to restore any routing information on a net that was affected during ECO implementation. lsicleaneco is a tool in itself and is not part of this disclosure. This tool basically facilitates the preservation of routing on nets wherein a simple net replacement occurred, i.e., if there were a net (net1) that hooked up two ports and the ECO replaced net1 with net2 (still connecting the same two ports), net2 will have the same routing properties as net1).

It should be noted that the lsiecoread tool 100 does not save the active cell after applying the ECO(s). The cell must be explicitly saved after running the tool 100.

Figure 10:
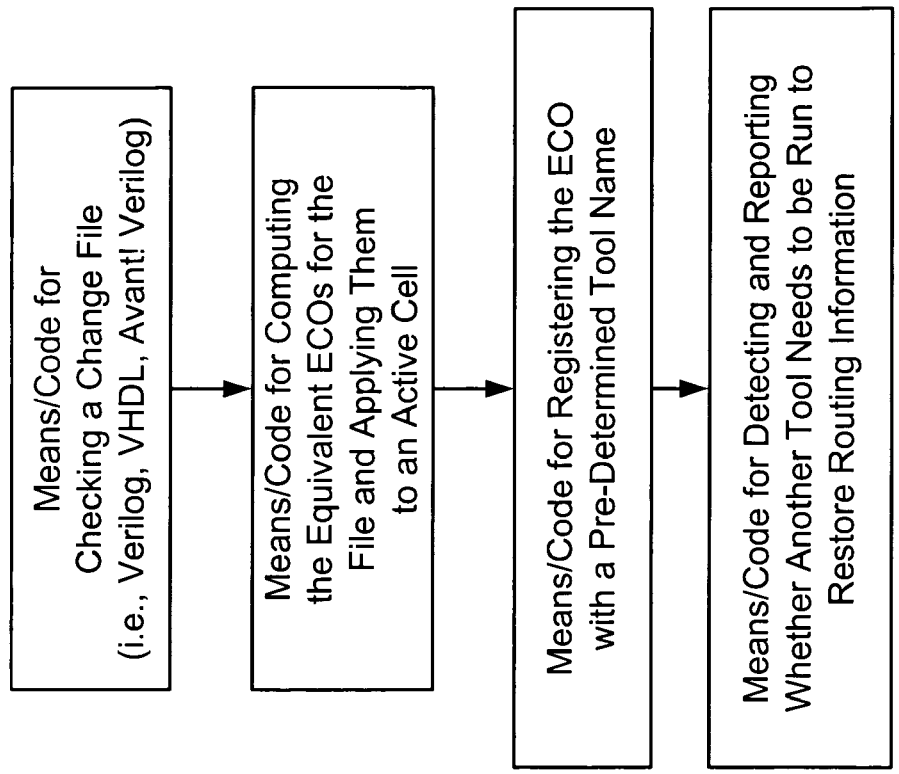
FIG. 10 is a block diagram of the tool shown in FIG. 1.

FIG. 1 illustrates the top-level automation of the lsiecoread tool 100 (FIG. 10 provides a block diagram). As illustrated, the required inputs to the tool 100 are an nmap file 105 and a change file 110. The Avant! library and cell also need to be opened prior to running the lsiecoread tool 100. The lsiecoread tool may be invoked using the following commend line:

```
lsiecoread "--change_file change_file_name --name_map
name_map_file_name [--check_only]"
```

For example:

```
lsiecoread "--change_file change_file_1 --name_map
../../map/trinity.nmap"
```

The paragraphs below describe the syntax for the change file 110 statements.

Names are in three possible name spaces: Verilog, VHDL, and Avant! Verilog. The language statement specifies these. The Verilog name space uses IEEE Verilog names. The VHDL name space is slash delimited with a leading slash. The Avant! Verilog name space is slash delimited with no leading slash. The name map library is used to specify names. Generated names follow the lsimrs (an LSI internal tool) conventions. The tool 100 reports all generated names in a Avant! Log file and to the Avant! console.

The following is the syntax to specify names. Only one of these statements need be used and it must appear as the first line in the change file 110.

```
language verilog; or
language vhdl; or
language avanti_verilog.
```

The connect statement connects a port of an instance to the port of another instance. It should be noted that when a connect/connect_net statement is used on a specific port, the existing net connected to the port in question is disconnected before the connect/connect_net is applied. This implies that a disconnect statement does not need to precede a connect/connect_net statement if the same port is involved. The connect/connect_net first disconnects the net connected to the port and only them implements the connect/connect_net functionality.

It should also be noted that the disconnect that occurs before the actual connect/connect_net, is only applicable to the port (for instance port1) that is specified in the connect/connect_net statement. The port to which it is connected (port2) remains untouched so that all nets attached to that port are unaffected.

The connect statement should be specified as follows:

connect instance_name port_name instance_name port_name

The following Table is an example.

TABLE 1 connect Example

| Verilog | VHDL | Avant! Verilog |
|---|---|---|
| connect top.a.b.c A a.d.e Z; | connect /a/b/c A /a/d/e Z; | connect a/b/c A a/d/e Z; |

In Table 1, port A of cell occurrence /a/b/c is connected to the net connected to /a/d/e port Z. The connect statement translates into the following Avant! change file:

```
-P A a/b/c netOriginallyConnectedToPortA
+P A a/b/c netConnectedToPortZ
+C Removes the net if it is no longer connected to anything
-N netOriginallyConnectedToPortA
```

Figure 2:
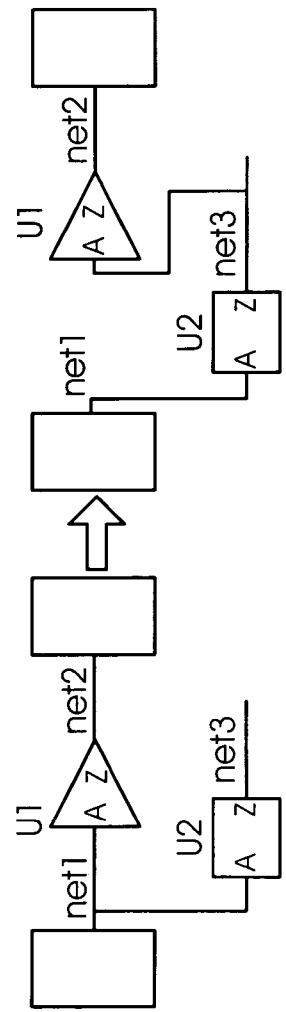
FIGS. 2–9 relate to the tool which is shown in FIG. 1.

Thus, connect U1 A U2 Z, as illustrated in FIG. 2.

The connect_net statement connects a port of an instance to a specified net. The connect_net statement should be specified as follows:
connect_net instance_name port_name net_name;
The following Table is an example.

TABLE 2 connect_net Example

| Verilog | VHDL | Avant! Verilog |
|---|---|---|
| connect_net top.a.b.c A top.VDD; | connect_net /a/b/c A VDD; | connect_net a/b/c A VDD; |

In Table 2, port A is connected to the power net, creating a permanent "1" on port A. The connect_net statement translates into the following Avant! change file:

```
-P A a/b/c netOriginallyConnectedToPortA
+P A a/b/c newNetName
+C Remove net if it is no longer connected to anything
-N netOriginallyConnectedToPortA
```

The disconnect statement removes the port from whatever net is connected to it and attaches it to a generated net. The disconnect statement should be specified as follows:
disconnect instance_name port_name;
The following Table is an example.

TABLE 3 disconnect Example

| Verilog | VHDL | Avant! Verilog |
|---|---|---|
| disconnect top.a.b.c A; | disconnect /a/b/c A; | disconnect a/b/c A; |

The disconnect statement translates into the following Avant! change file:

```
-P A a/b/c/ netConnectedToOriginalport
+C Remove net only if it is no longer connected to anything
-N netConnectedToOriginalport
+N LSI_ecoread_N1_netConnectedToOriginalport
+P A a/b/c/ LSI_ecoread_N1_netConnectedToOriginalport
```

Figure 3:
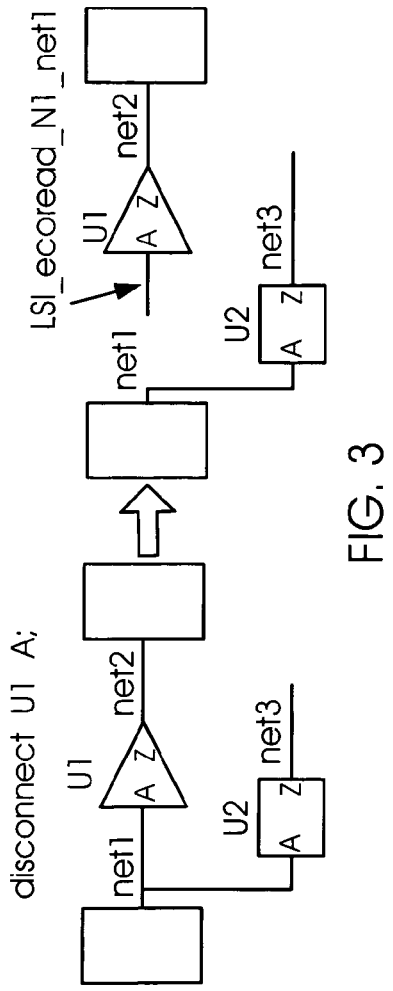

Thus, disconnect U1 A;, as illustrated in FIG. 3.

It should be noted that a new net is created and attached to the now disconnected port A. This is to avoid the problem of "anonymous nets". Any unconnected port really is not unconnected—it should have its own unique net attached.

The remove statement removes the instance along with its port connections. The remove statement should be specified as follows:
remove instance_name;
The following Table is an example.

TABLE 4 remove Example

| Verilog | VHDL | Avant! Verilog |
|---|---|---|
| remove top.a.b.c; | remove /a/b/c; | remove a/b/c; |

The Avant! change file would look like the following when a simple buffer is involved:

```
-P A a/b/c/ NetConnecteToAport
+C If there are no more ports connected to
NetConnectedToAport
-N NetConnectedToAport
-P Z a/b/c NetConnectedToZport
+C If there are no more ports connected to
NetConnectedToZport
-N NetConnectedToZport
-I a/b/c BUFDFP
```

Figure 4:
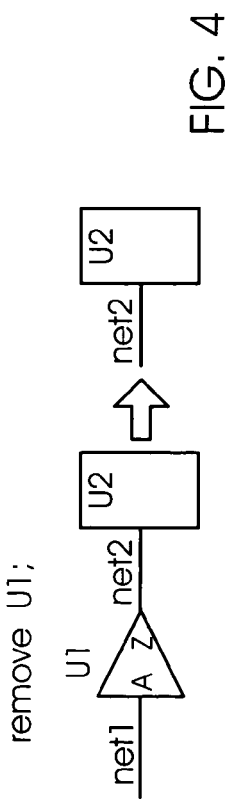

Thus, remove U1;, as illustrated in FIG. 4.

It should be noted that generically if A does not connect to any port it gets deleted as part of the remove statement. In FIG. 4, net1 is also deleted along with instance U1 because it was not connected to anything else. Because net2 is connected to instance U2, it was not deleted.

The add statement adds an instance of a given types. The add statement should be specified as follows:
add instance_name cell_type_name;
The following Table is an example.

TABLE 5 add Example

| Verilog | VHDL | Avant! Verilog |
|---|---|---|
| add top.a.b.c. BUFFDFP; | add /a/b/c BUFFDFP; | add a/b/c BUFFDFP; |

The add statement adds a BUFFDFP cell with an instance name of /a/b/c. The ports of this added instance has to be connected using a 'connect' or a 'connect_net' statement following the 'add' statement in the change file. The 'add' statement by itself will error out if the ports of the added instance are not connected. The Avant! change file would look like this:
+I a/b/c BUFFDFP The replace statement replaces the instance with another cell type connecting all the same named ports together. The replace statement should be specified as follows:
replace instance_name cell_type_name;
The following Table is an example.

TABLE 6 replace Example

| Verilog | VHDL | Avant! Verilog |
|---|---|---|
| replace top.a.b.c BUFFDFP; | replace /a/b/c BUFFDFP; | replace a/b/c BUFFDFP; |

The Avant! change file if the replaced cell was a buffer is as follows:

+R a/b/c BUFFDFP U211

The tool does not support replacing a cell with a non-identical cell-type (for example, replacing a buffer with an AND gate or vice-versa).

The buffer statement takes a signal and adds a buffer to it. The buffer statement should be specified as follows:

buffer   instance_name   port_name   instance_name cell_type_name;

The following Table is an example.

TABLE 7 buffer Example

| Verilog | VHDL | Avant! Verilog |
|---|---|---|
| buffer top.a.b.c Z top.a.b.dbuf BUFDFP; | buffer /a/b/c Z /a/b/dbuf BUFDFP; | buffer a/b/c Z /a/b/dbuf BUFDFP; |

Assuming port Z of instance a/b/c is connected to port A of instance a/b/d, the above buffer statement will buffer the signal connected to instance /a/b/c port Z with a cel type BUFDFP having the instance name /a/b/dbuf. The Avant! change file is as follows:

```
+N LSI_ecoread_N1_OldNetName
+I a/b/dbuf BUFDFP
-P A a/b/d OldNet
+P A a/b/d LSI_ecoread_N1_OldNetName
+P Z a/b/dbuf LSI_ecoread_N1_OldNetName
+P A a/b/dbuf OldNet
```

Figure 5:
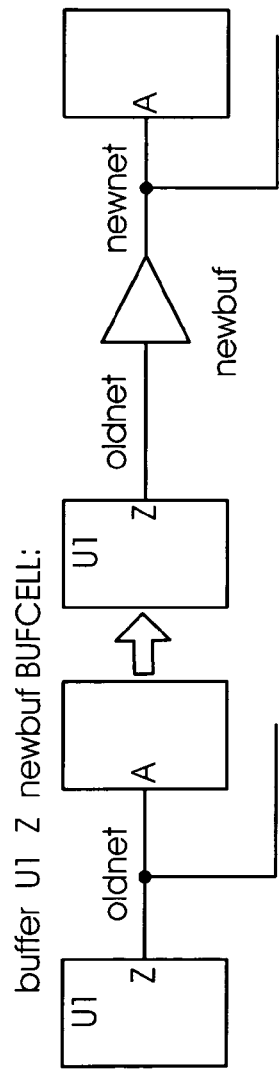
Figure 6:
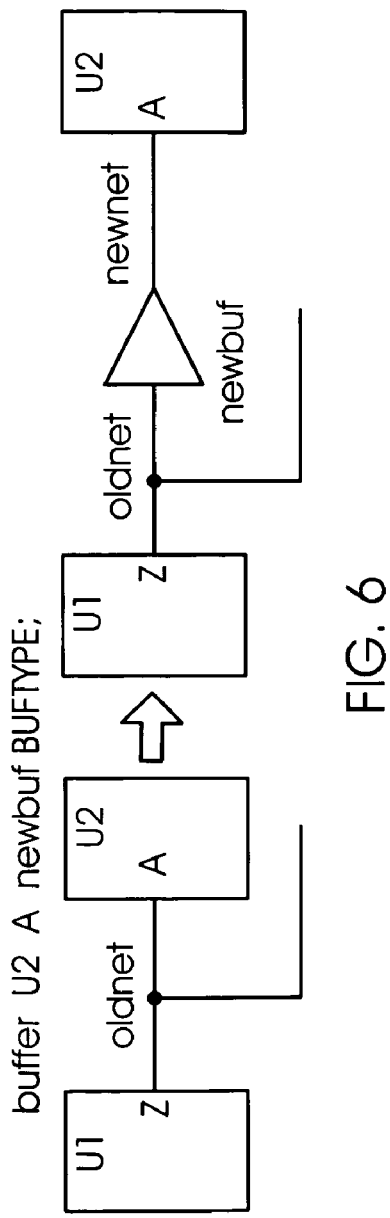
Figure 7:
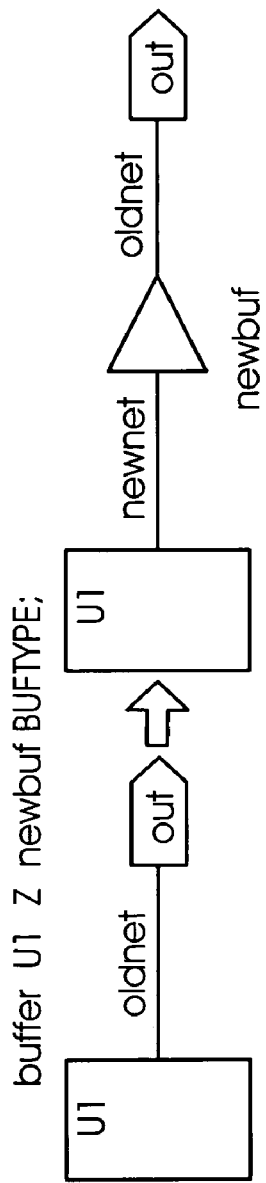
Figure 8:
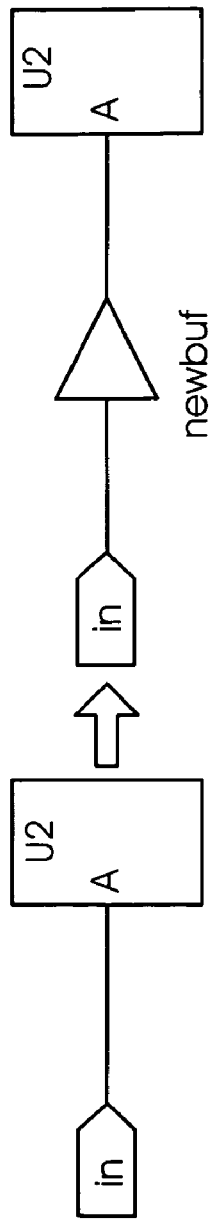

FIGS. 5, 6, 7 and 8 show the different ways the buffer statement can be used. FIG. 5 shows the buffering of an output port, "buffer U1 Z newbuf BUFCELL;", with the buffer being upstream from the node. FIG. 6 shows the buffering of an input port, "buffer U2 A newbuf BUFTYPE;", with the buffer being downstream from the node. This mode can be used to buffer to a specific net connected to the port. FIG. 7 shows the buffer attached to IO ports (output), "buffer U1 Z newbuf BUFTYPE;". FIG. 8 shows the buffer attached to IO ports (input), "buffer U2 A newbuf BUFTYPE;".

The buffer_autoname statement works similar to the buffer statement except that the new buffer's instance name need not be specified. This statement is very useful when a large number of buffers must be inserted in a design. The buffer_autoname statements should be specified as follows:
buffer_autoname   instance_name   port_name   cell_type_name;

The following Table is an example:

TABLE 8 buffer_autoname Example

| Verilog | VHDL | Avant! Verilog |
|---|---|---|
| buffer_autoname top.a.b.c Z BUFDFP; | buffer_autoname /a/b/c Z BUFDFP; | buffer_autoname a/b/c Z BUFDFP; |

The buffer_autoname statement buffers the signal connected to /a/b/c port Z with a cell type BUFDFP with cell instance name LSI_ecoread_C1_OldNetName. The Avant! change file is as follows:

```
+N LSI_ecoread_N1_OldNetName
+I LSI_ecoread_C1_OldNetName BUFDFP
-P A a/b/d OldNet
+P A a/b/d LSI_ecoread_N1_OldNetName
+P Z LSI_ecoread_C1_OldNetName LSI_ecoread_N1_OldNetName
+P A LSI_ecoread_C1_OldNetName OldNet
```

The unbuffer statement removes the buffer occurrence for a given instance and shorts the input and outputs together. The unbuffer statement should be specified as follows:

```
unbuffer instace_name; wherein instance_name is the name of
the buffer that needs to be removed.
```

The following Table is an example.

TABLE 9 unbuffer Example

| Verilog | VHDL | Avant! Verilog |
|---|---|---|
| unbuffer top.a.b.c; | unbuffer /a/b/c; | unbuffer a/b/c; |

Assuming port A of buffer instance a/b/c is connected to port Z of instance a/b/d and port Z of buffer instance a/b/c is connected to port A of instance a/b/e, the above unbuffer statement will delete the buffer instance a/b/c. The following change file is produced:

```
+C a/b/d is the instance to which the input A of a/b/c
buffer is hooked up. The buffer drives port A of instance
a/b/e
-P A a/b/e newnet
+P A a/b/e oldnet
-P A a/b/c oldnet
-P Z a/b/c newnet
-I buffer_inst
+C If there are no more ports connected to
toBeDeletedNetName
-N newnet
```

Figure 9:
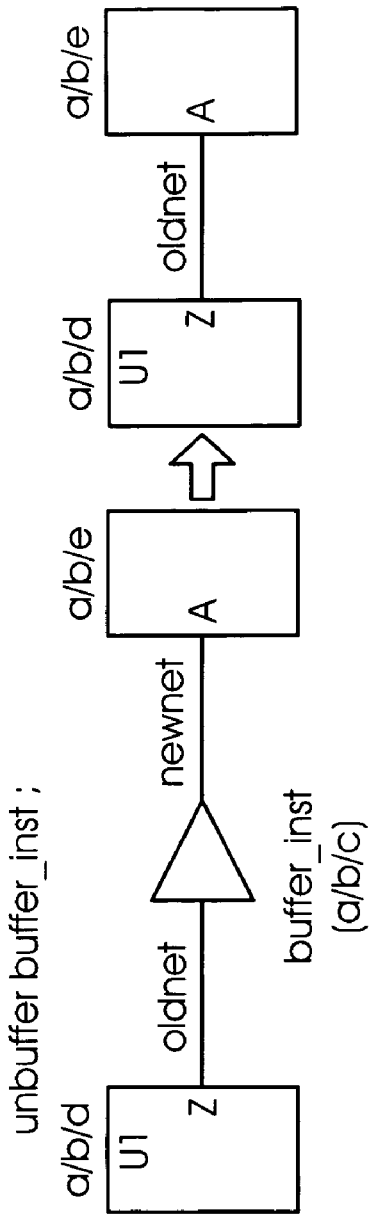

Thus, unbuffer buffer_inst;, as illustrated in FIG. 9.

The rename_net statement renames the net connected to the specified port. The most common use is to override the default generated names. If the net does not change connectivity, then in addition to the ECO information generated, the tool performs the equivalent to an lsicleaneco operation. The lsicleaneco tool dumps the routing for a given net and reads it back in under the new name. This is required because Avant! clears out the routing information upon an ECO and you need to preserve it when the connectivity does not really change. The rename_net statement should be specified as follows:

rename_net instance_name port_name net_name

The following Table is an example.

TABLE 10 rename_net Example

| Verilog | VHDL | Avant! Verilog |
|---|---|---|
| rename_net top.a.b.c Z newName; | rename_net /a/b/c Z newName; | rename_net a/b/c Z newName; |

This produces the following Avant! change file:

```
+C Repeat for all ports on origNetName
-P Z a/b/c origNetName
-N origNetName
+C Error out if newName already exists
+N newName
+C Repeat for all ports on origNetName
+P Z a/b/c newName
```

Comments in the new change file syntax are indicated by a number symbol (#) in the first column of a line. Just like in shell scripting languages, which use this comment character, a new line terminates the command. Note that, unlike shell scripts, the comment character may only appear in the first column of a line.

After the ECOs are successfully applied to the database, the Avant! ECO history is updated to show the changes that were made. The ECOs are automatically dumped to the ecoread_dump.eco file.

The tool does not replace non-identical cell types (with different named input/output ports). When the tool is used with the -check_only switch and statements are specified with hierarchical annotations such as "remove test1" wherein test1 is the instantiated name of module test2 in the netlist, the tool will not flag an error.

As Avant! operates on a flat database, the correct sequence for implementing the above scenario would be:

remove test2/<cell_instance>;

Repeating the above statement for all cell-instances of test2 in essence removes test1.

An embodiment of the invention provides an improved method and apparatus for implementing engineering change orders, and a method and apparatus for implementing engineering change orders which allows a user to specify any and all changes required to the design database in a user-friendly, comprehendible, easy to learn and maintain type of format to the tool, for processing. The invention provides a tool for implementing engineering change orders which are simple, user-friendly, manageable, easy to decipher/edit and which provide significant turn-around-time (TAT) benefits in comparison to the Synopsys/Avant! ECO flow. The tool supports port based ECOs, compared to net based ECOs, which are extremely easy to implement and do not require the user to keep track of nets that are hooked up to these ports.

Figure 11:
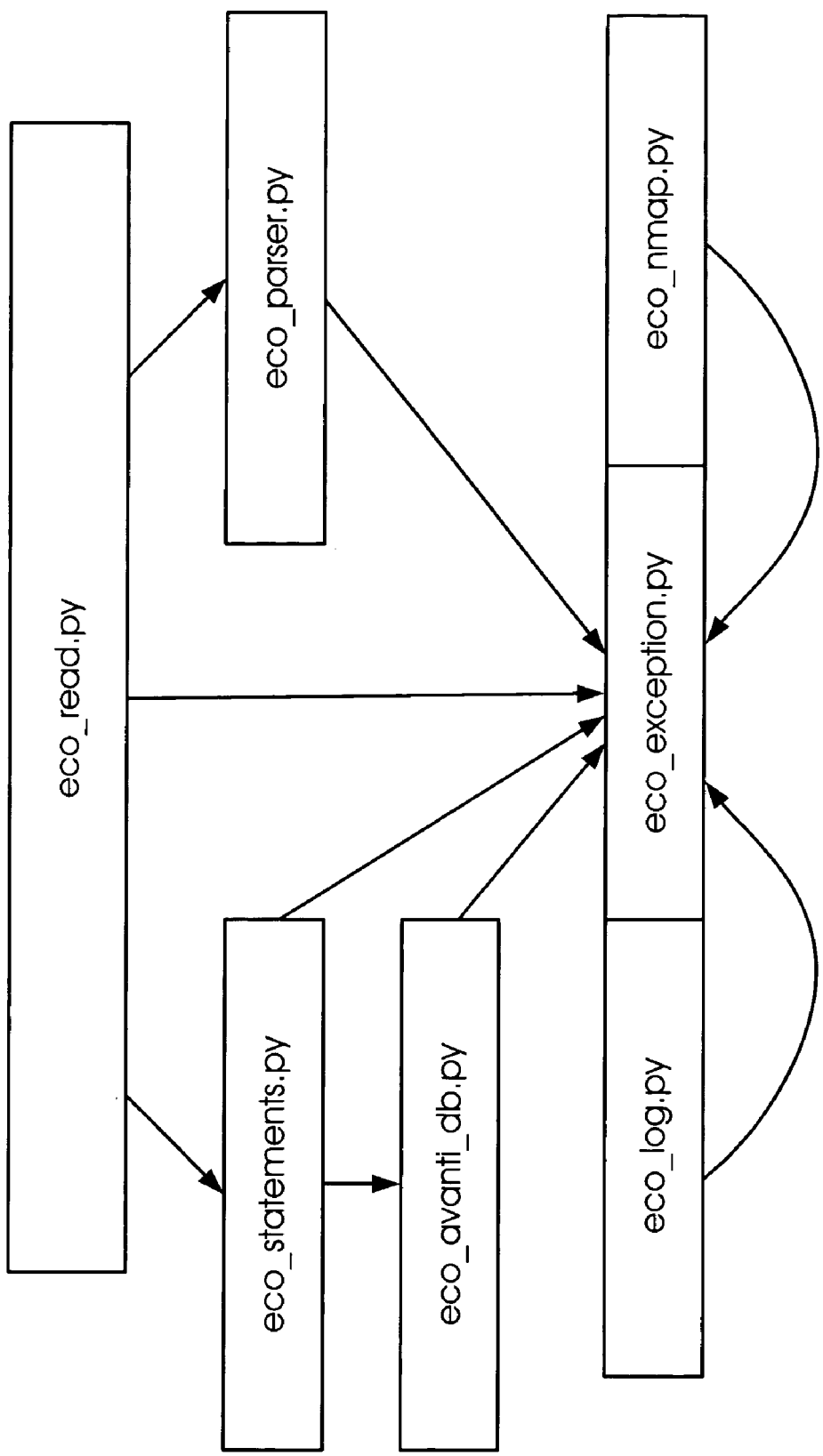
FIG. 11 describes the code control flow of the seven files which comprise a preferred embodiment of the tool.

The tool may be provided as seven files which work together as shown in FIG. 11. Each one of the files identified in FIG. 11 is provided on the compact discs which have been filed with the present application and incorporated herein by reference. As shown, the lsiecoread Tool has in total six python script files (.py) which performs specific functions and are called by the main module. The sub modules (.py files) are also called within themselves for specific operations (like handling exceptions, logging etc.). Below are the details about the top level functions of each module, and FIG. 11 explains the control flow for the lsiecoread tool.

eco_read.py:
  Parses the command line options
  Has code to detect if lsicleaneco needs to be run
  Calls functions in eco_parser.py to parse the change file
  Calls eco_statements.py for each ECO and applies the ECOs to the Synopsys databse and updates the same.
  Keeps track of all nets touched during the ECO operation(s)

eco_statements.py:
  This module performs the ECO changes for all the statements in the change file and updates the Synopsys database.

eco_parser.py:
  Parses the language statement in the change file
  Parses each line in the change file that describes an ECO. In the process it translates instance names to Avanti/Synopsys Verilog name spaces, based on the language statement.

eco_nmap.py:
  This does the actual name mapping for instances, ports and nets. The name mapping is from Verilog to Avanti/Synopsys Verilog.

eco_avanti_db.py:
  This has all the functions for Avanti/Synopsys database checking operations. This module is invoked by other modules to check for existence of database objects.

eco_exception.py:
  This module handles all exceptions that are used for the tool. This is used by all modules to flag either a user error or a data handling exception encountered by the tool.

eco_log.py:
  This module logs the data for the tool. This is used by all modules to capture log data.

In FIG. 11, "eco_read.py" is the main module that is invoked when the tool is called; "eco_statements.py", "eco_avanti_db.py" and "eco_parser.py" are modules that perform the major functions; and "eco_log.py", "eco_exception.py" and "eco_nmap.py" are common python files used by other .py files. In FIG. 11, the arrows indicate control flow in the code.

While a preferred embodiment of the present invention is shown and described, it is envisioned that those skilled in the art may devise various modifications of the present invention without departing from the spirit and scope of the appended claims.

The invention is claimed as follows:

1. A tool for implementing engineering change orders, said tool comprising: means for checking a change file; means for computing equivalent engineering change orders for the change file and applying the engineering change orders to an active cell, wherein the tool is configured to not save the active cell after the engineering change orders are applied and instead requires that a user manually save the active cell after the tool is run.

2. A tool as recited in claim 1, further comprising means for registering the engineering change orders.

3. A tool as recited in claim 1, further comprising means for registering the engineering change orders with a pre-determined tool name.

4. A tool as recited in claim 1, further comprising means for detecting and reporting if another tool needs to be run to restore routing information.

5. A tool as recited in claim 1, wherein the tool is configured to work with three different name spaces: Verilog, VHDL and Avant! Verilog.

6. A tool as recited in claim 1, further comprising means for registering the engineering change orders with a pre-determined tool name, means for detecting and reporting if another tool needs to be run to restore routing information, wherein the tool is configured to work with three different name spaces: Verilog, VHDL and Avant! Verilog.

7. A method of implementing engineering change orders, said method comprising: using a tool to check a change file, compute equivalent engineering change orders for the change file, and apply the engineering change orders to an active cell; and, instead of having the tool automatically save the active cell after the engineering change orders are applied, manually saving the active cell after the tool is run.

8. A method as recited in claim 7, further comprising registering the engineering change orders.

9. A method as recited in claim 7, further comprising registering the engineering change orders with a pre-determined tool name.

10. A method as recited in claim 7, further comprising detecting and reporting if another tool needs to be run to restore routing information.

11. A method as recited in claim 7, further comprising registering the engineering change orders with a pre-determined tool name, and detecting and reporting if another tool needs to be run to restore routing information.

12. A method as recited in claim 7, further comprising using the tool to register the engineering change orders.

13. A method as recited in claim 7, further comprising using the tool to register the engineering change orders with a pre-determined tool name.

14. A method as recited in claim 7, further comprising using the tool to detect and report if another tool needs to be run to restore routing information.

15. A method as recited in claim 7, further comprising using the tool to register the engineering change orders with a pre-determined tool name, and detect and report if another tool needs to be run to restore routing information.

16. A method for implementing engineering change orders, said method comprising: verifying a syntax of a change file without making any database crosschecks; computing equivalent engineering change orders for the change file; and applying the engineering change orders to an active cell.

17. A method as recited in claim 16, further comprising using a tool to verify the syntax, compute equivalent engineering change orders, and apply the engineering change orders, and, instead of having the tool automatically save the active cell after the engineering change orders are applied, manually saving the active cell after the tool is run.

18. A tool for implementing engineering change orders, said tool comprising: means for verifying a syntax of a change file without making any database crosschecks; means for computing equivalent engineering change orders for the change file; and means for applying the engineering change orders to an active cell.

19. A tool as recited in claim 18, wherein the tool is configured to not save the active cell after the engineering change orders are applied and instead requires that a user manually save the active cell after the tool is run.

\* \* \* \* \*